United States Patent [19]

Takashina et al.

[11] Patent Number: 5,959,436
[45] Date of Patent: Sep. 28, 1999

[54] CHARGE AND DISCHARGE CONTROL CIRCUIT HAVING LOW VOLTAGE DETECTING MEANS FOR PREVENTING CHARGING OF AN ABNORMAL CELL

[75] Inventors: Takayuki Takashina, Tokyo; Shinichi Yoshida; Hiroshi Mukainakano, both of Chiba, all of Japan

[73] Assignee: Seiko Instruments Inc., Japan

[21] Appl. No.: 09/018,073

[22] Filed: Feb. 3, 1998

[51] Int. Cl.[6] .................................................. H01M 10/46
[52] U.S. Cl. ........................................ 320/134; 320/136
[58] Field of Search ................................... 320/121, 123, 320/127, 134, 136, 158, FOR 112, FOR 113, FOR 138, FOR 147; 324/426, 433; 340/636; 429/61

[56] References Cited

U.S. PATENT DOCUMENTS

| | | | |
|---|---|---|---|
| 5,502,629 | 3/1996 | Ito et al. | 320/166 |
| 5,547,775 | 8/1996 | Eguchi et al. | 320/118 |
| 5,554,919 | 9/1996 | Uchida | 320/132 |
| 5,783,998 | 7/1998 | Nakajou et al. | 324/426 |

*Primary Examiner*—Edward H. Tso
*Attorney, Agent, or Firm*—Adams & Wilks

[57] ABSTRACT

A charge/discharge control circuit cuts off a current path to stop charging of an abnormal secondary cell when the voltage of the secondary cell is less than the threshold voltage of a MOS transistor. The charge/discharge control circuit includes a charge and discharge control circuit for monitoring the voltage of a secondary cell and outputting a signal for controlling the charging and discharging of the secondary cell, a switch circuit for receiving the output signal of the charge and discharge control circuit to stop the charging of the secondary cell in an overcharged or overdischarged state, and a low voltage detecting circuit for receiving the output signal of the charge and discharge control circuit, detecting whether the voltage of the secondary cell is below a predetermined voltage, which is below the overdischarge voltage and which is equal to the threshold voltage of a MOS transistor, and for controlling the switch circuit to prevent charging of the secondary cell if the voltage thereof is below the predetermined voltage.

12 Claims, 9 Drawing Sheets

CHARGE AND DISCHARGE CONTROL CIRCUIT HAVING LOW VOLTAGE DETECTING MEANS FOR PREVENTING CHARGING OF AN ABNORMAL CELL

BACKGROUND OF THE INVENTION

The present invention relates to a charge and discharge control circuit for controlling the charge and discharge of a secondary cell, and to a chargeable power source device using said circuit.

A chargeable power source device has been disclosed in the prior art as shown in a circuit block diagram of FIG. 2. The construction such as FIG. 2, for example, is shown in Provisional Publication No. H4-74530 "A chargeable power source device". A secondary cell 201 is connected to an external terminal 205 or 204 through a switch circuit 203. Further, a charge and discharge control circuit 202 is connected to the secondary cell 201 in parallel. The charge and discharge control circuit 202 has a function to detect voltage of the secondary cell 201. A signal is generated by the charge and discharge control circuit 202 so as to turn the switch circuit 203 OFF at either of overcharge state (the voltage of the cell is higher than a fixed voltage) and an overdischarge state (the voltage of the cell is lower than a fixed voltage) of the secondary cell 201. By stopping discharge when the external terminal 204 reaches a certain voltage, it is also possible to limit current flowing through the switch circuit 203. This means that discharge can be stopped (overcurrent control) when overcurrent flows. This operation is hereinafter referred to as overcurrent protection.

A numeral 210 shows a positive pole of the secondary cell 201 and a numeral 211 shows a negative pole of the secondary cell 201.

Numerals 206 and 207 each show a signal line, respectively.

A numeral 208 shows a charger and a numeral 209 shows a load.

As another example of the typical charge and discharge power source device comprising a secondary cell, a power supply device such as shown in a circuit block diagram of FIG. 3 is known. In the circuit, the switch circuit 303 is connected in series to a negative pole 311 of the secondary cell 301.

However, the charge and discharge control circuit constructed like that above does not detect when the voltage of the cell is less than a threshold voltage of a MOS transistor, and a problem occurs when a charger is connected.

A numeral 310 shows a positive pole of the secondary cell 301.

A numeral 302 shows a charge and discharge control circuit.

Numerals 304 and 305 each show an external terminal, respectively.

Numerals 306 and 307 each show a signal line, respectively.

A numeral 309 shows a load.

In general, two FETs (Field Effect Transistor) are used for the switch circuit. As an another example of a device using the same switch circuit, a power source device shown in circuit block diagram in FIG. 4 in which, a switch circuit 403 comprises two FETs.

The switch circuit operates so as to turn an FET 412 OFF in an overdischarge state and to turn an FET 413 OFF in an overcharge state. Because of that, a signal line for switch circuit control is divided two, 407A and 407B. Also in overcurrent state, the circuit operates so as to turn the FET 412 OFF.

In this circuit, when a charger 408 is connected at the over-discharge state of cell voltage as shown in FIG. 4, charge current flows through a parasitic diode of the FET so as to charge a secondary cell 401 because the FET 412 is OFF and the FET 413 is ON. This occurs during ordinary circuit operation in the normal cell condition. However, even when the voltage of the cell is less than a threshold voltage of a MOS transistor, the circuit operates so as to let charge current flow and to charge the cell even if it is an abnormal cell. Charging an abnormal cell may break the cell.

A numeral 404 shows a positive pole of the secondary cell 401 and a numeral 411 shows a negative pole of the secondary cell 401.

Numerals 404 and 405 show an external terminal, respectively

A numeral 406 shows a signal line and a numeral 409 shows a load.

To solve the above-described problem, an object of the present invention is to provide a high reliability and safe charge and discharge control circuit which does not permit charge current to be pass through the cell to charge when voltage of the cell is less than the threshold voltage of the MOS transistor and the charger is connected.

SUMMARY OF THE INVENTION

To solve the above-described problem, the charge and discharge control circuit of the present invention has a circuit construction in which a switch circuit is turned OFF so as not to let charge current flow when voltage of the secondary cell is less than the threshold voltage of the MOS transistor and at that time the charger is connected. This construction prevents charging of an abnormal cell and prevents damage of the cell.

The charge and discharge control circuit constructed as described above makes the reliability of the whole instrument high and can improve safety by protecting against breakage of the secondary cell because the circuit cuts a charge current so as not to charge the secondary cell when voltage of the cell is less than the threshold voltage of the MOS transistor and the charger is connected.

DETAILED DESCRIPTION OF THE INVENTION

Referring FIG. 1, an embodiment of the present invention will be described.

Figure 1:
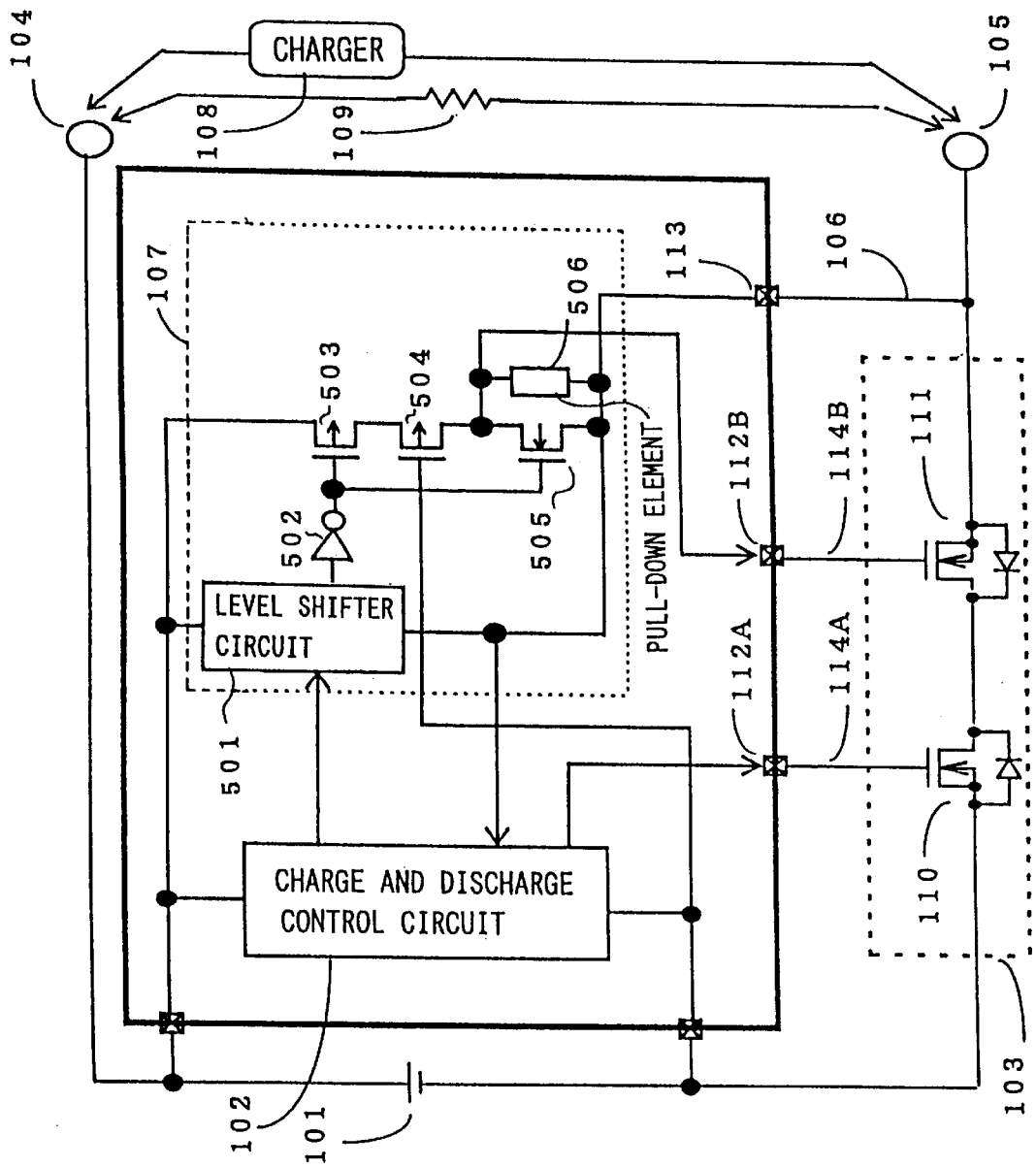
FIG. 1 is a circuit block diagram of a chargeable power source device of the present invention.
Figure 2:
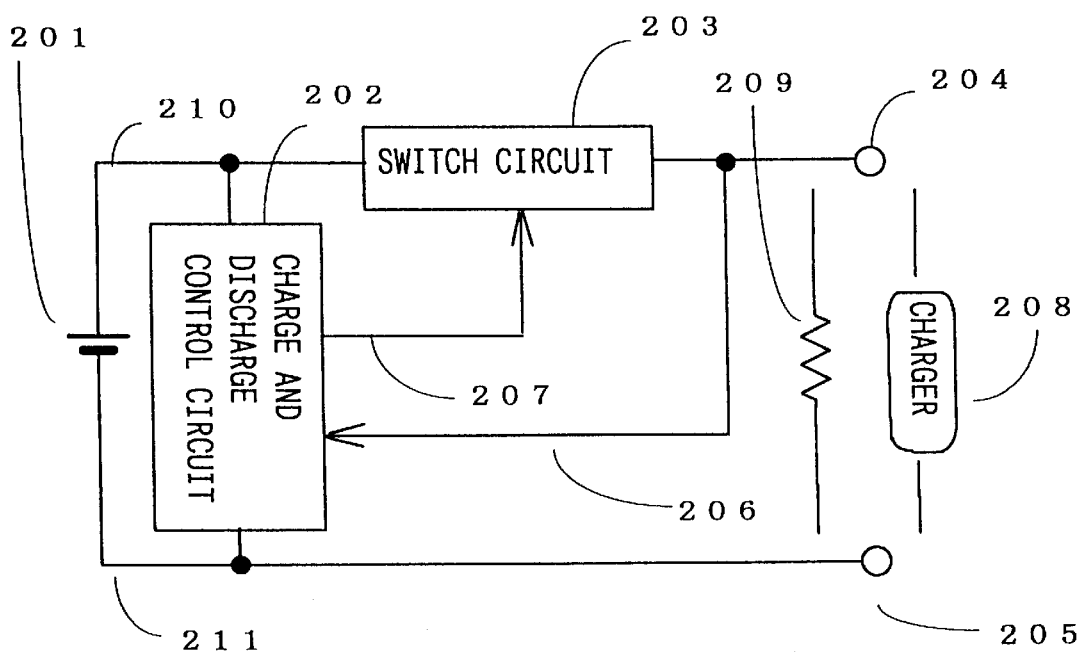
FIG. 2 is a circuit block diagram of a typical chargeable power source device.
Figure 3:
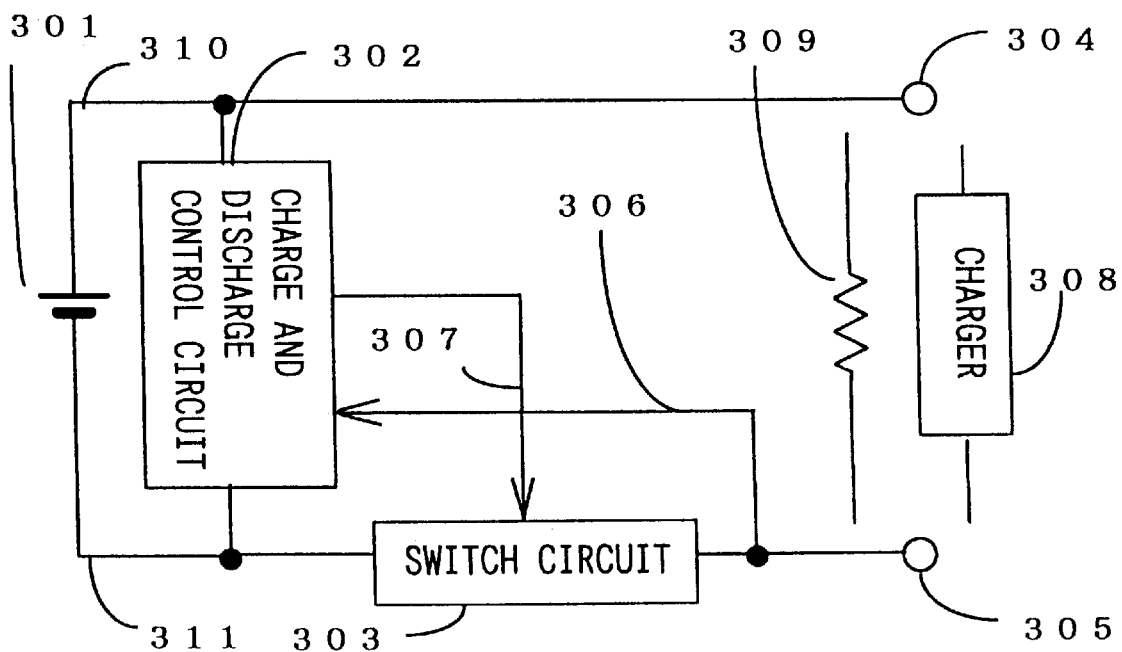
FIG. 3 is a circuit block diagram showing an another example of the typical chargeable power source device.
Figure 4:
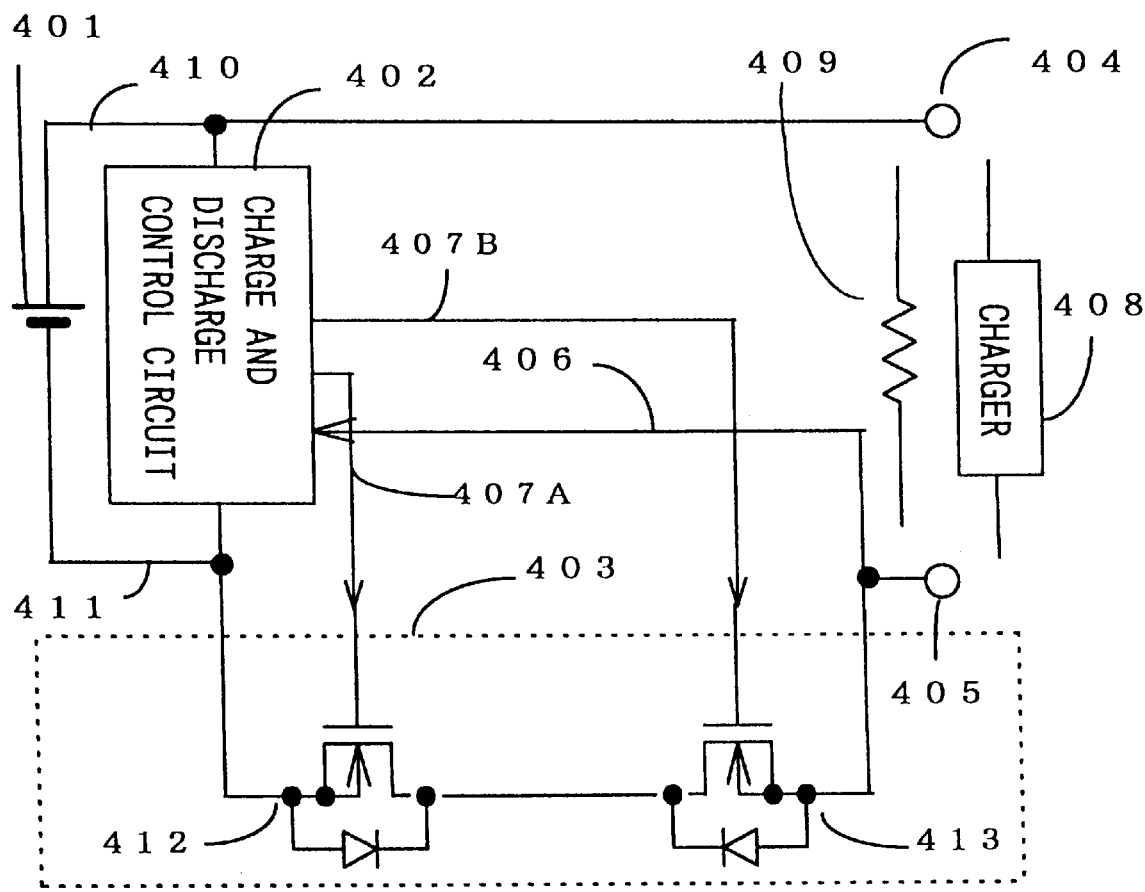
FIG. 4 is a circuit block diagram showing an another example of the typical chargeable power source device.

FIG. 1 is a circuit block diagram of a charge and discharge control circuit of the present invention.

A secondary cell 101 is connected to external terminals 104 and 105 through a switch circuit 103. The switch circuit 103 comprises two N-channel FETS. Voltage of the secondary cell 101 is monitored by a charge and discharge control circuit 102 and a low voltage detecting circuit 107. The charge and discharge control circuit 102 is connected to an FET 110 with a signal line 114A, controls the ON/OFF state of the FET 110, is connected to an FET 111 with a signal line 114B through the low voltage detecting circuit 107, and controls the ON/OFF state of the FET 111. The low voltage detecting circuit 107 is connected between the external terminals 104 and 105 in parallel to a charger 108 through an overcurrent detecting terminal 113 so as to operate with the voltage as a power source.

A charger 108 for charging the secondary cell 101 or an instrument (a load 109 as viewed from the secondary cell) driven by the secondary cell 101 is connected between external terminals 104 and 105. The FET 110 and the FET 111 are connected in series to the external terminal 105 or 104. In the illustrated embodiment, the FET 110 and the FET 111 are connected in series to the external terminal 105.

First, the construction of the circuitry comprising the low voltage detecting circuit 107 will be described referring FIG. 1.

A signal from the charge and discharge control circuit 102 is input to a level shifter circuit 501. Output of the level shifter circuit 501 is input to a waveform shaping inverter 502.

Output of the inverter 502 is connected to a gate of P-channel MOS transistor 503 and a gate of N-channel MOS transistor 505. A source of the P-channel MOS transistor 503 is connected to the external terminal 104, and a drain thereof is connected to the source of the P-channel MOS transistor 504. The source of P-channel MOS transistor 504 is connected to the drain of P-channel MOS transistor 503, the gate thereof is connected to the negative terminal of the secondary cell 101, and the drain thereof is connected to the drain of the N-channel MOS transistor 505 and one terminal of a pull-down element 506. Further, the drain of P-channel MOS transistor 504 is connected to the gate of the FET 111 in the switch circuit 103 from an overcharge signal output terminal 112B through a signal line 114B. The source of N-channel MOS transistor 505 is connected to the external terminal 105 with a signal line 106 through an overcurrent detecting terminal 113, the gate thereof is connected to the output of the waveform shaping inverter 502, and the drain thereof is connected to the drain of the P-channel MOS transistor 504 and one terminal of a pull-down element 506. Further, the drain of N-channel MOS transistor 505 is connected to the gate of the FET 111 in the switch circuit 103 from an overcharge signal output terminal 112B through a signal line 114B. A power source of each element included in the low voltage detecting circuit 107, which are the level shifter circuit 501, the waveform shaping inverter 502, the P-channel MOS transistors 503 and 504, the N-channel MOS transistor 505, and the pull-down element 506, is supplied by the external terminals 104 and 105.

Next, the operation of the low voltage detecting circuit 107 will be described referring FIG. 1. The level shifter circuit 501 outputs a high voltage ("H" hereafter) to the external terminal 104 when an input signal, namely the output signal of the charge and discharge control circuit 102, is at a high level, and outputs a low voltage ("L" hereafter) to the external terminal 105 when the output signal of the charge and discharge control circuit 102 is a low level. Output of the level shifter circuit 501 is shaped constitute a more rectangular wave by the waveform shaping inverter 502, and the waveform shaping inverter 502 outputs "L" when output of the level shifter circuit 501 is "H" and outputs "H" when the output of the level shifter circuit 501 is "L." The P-channel transistor 504 monitors the voltage of the secondary cell 101, turns ON when the voltage of the secondary cell 101 is higher than the threshold voltage of the P-channel MOS transistor 504, and turns OFF when the voltage of the secondary cell 101 is less than the threshold voltage of the P-channel MOS transistor 504. The last output stage comprising the P-channel MOS transistors 503 and 504, and N-channel MOS transistor 505 outputs "H" at the output terminal 112B in the case where the P-channel MOS transistor 504 is ON, the P-channel MOS transistor 503 turns ON when and the N-channel MOS transistor 505 turns OFF if output of the waveform shaping inverter 502 is "L." The last output stage outputs "L" at the output terminal 112B when the P-channel MOS transistor 503 turns OFF and the N-channel MOS transistor 505 turns ON if the output of the waveform shaping inverter 502 is "H." This means that voltage of the output terminal 112B is turned "H" or "L" depending on the output signal of the charge and discharge control circuit 102 if voltage of the secondary cell 101 is higher than the threshold voltage of the P-channel MOS transistor 504.

On the other hand, in the case that P-channel MOS transistor 504 is OFF, the last output stage outputs "L" at the output terminal 112B when the N-channel MOS transistor 505 turns ON and the P-channel MOS transistor 503 turns OFF if the output of the waveform shaping inverter 502 is "H." Although the N-channel MOS transistor 505 turns OFF and the P-channel MOS transistor 503 turns ON if the output of the waveform shaping inverter 502 is "L", the last output stage outputs "L" at the output terminal 112B because the P-channel MOS transistor 504 remains OFF and is connected to the pull-down element 506. Therefore, the last output stage forcibly outputs "L" independent of the output level of the charge and discharge control circuit 102 in the case that voltage of the secondary cell 101 is lower than the threshold voltage of P-channel MOS transistor 504.

Next, the whole circuit operation will be described.

The threshold voltage of the P-channel MOS transistor 504 is set at lower voltage than the overdischarge voltage and at the upper limit voltage under which the secondary cell 101 should not be allowed to be charged. The charge and discharge control circuit 102 monitors the voltage of the secondary 101, outputs a high signal so as to turn the FET 110 ON when voltage of the secondary cell 101 is in the overcharge state, and outputs a low signal to the low voltage detecting circuit 107. As the secondary cell 101 is in the overcharge state, of course the voltage of the cell is higher than the threshold voltage of the P-channel MOS transistor 504. Therefore, the P-channel transistor 504 is ON and the low voltage detecting circuit 107 outputs "L" to the gate of the FET 111 in the switch circuit 103 as the overcharge signal from the charge and discharge control 102. As the voltage between the gate and source of the FET 111 becomes 0V, the FET 111 turns OFF. Therefore, charge current from the charger 108 is cut off so that charging of the secondary cell 101 stops.

The charge and discharge control circuit 102 outputs "L" to the output terminal 112A so as to turn the FET 110 OFF and outputs "H" to the low voltage detecting circuit 107 in the overdischarge state of voltage of the secondary cell 101. The P-channel transistor 504 remains ON because the voltage of the secondary cell 101 is merely in an overdischarge state and is still higher than the threshold voltage of the P-channel transistor 504. Therefore, the low voltage detecting circuit 107 outputs "H" to the output terminal 112B by the signal of the charge and discharge control circuit 102 so as to turn the FET 111 ON. By this operation, discharge current to the load 109 is stopped and discharge of the secondary cell 101 stops. By replacing the load 109 with the charger 108 in this state, the FET 111 remains ON, the parasitic diode of the FET 110 turns forward direction, charge current path from the charger 108 to the secondary cell 101 is connected, and charge starts. It means that operation of previous protecting circuit is assured. The charge and discharge control circuit 102 outputs the overdischarge signal , namely "L" to the output terminal 112A and "H" to the low voltage detecting circuit 107 when the voltage of the secondary cell 101 in the overdischarge state is less than the threshold voltage of the P-channel MOS transistor 504 because of self-discharge and the like. However, voltage between the gate and the source of the FET 111 in the switch circuit 103 becomes 0V and the FET 111 turns OFF because the low voltage detecting circuit 107 outputs "L" to the output terminal 112B independent of the output of the charge and discharge control circuit 102. Although the parasitic diode of the FET 110 keeps the forward direction if the charger 108 is connected to the external terminals 104 and 105 in this state, discharge current to the secondary cell 101 is cut and the secondary cell 101 is not charged because the FET 111 is OFF and the parasitic diode keeps the reverse direction.

Therefore, it is possible to stop charge in the abnormal state which voltage of the secondary cell 101 is less than overdischarge voltage and less than the threshold voltage of the P-channel MOS transistor 504.

Figure 5:
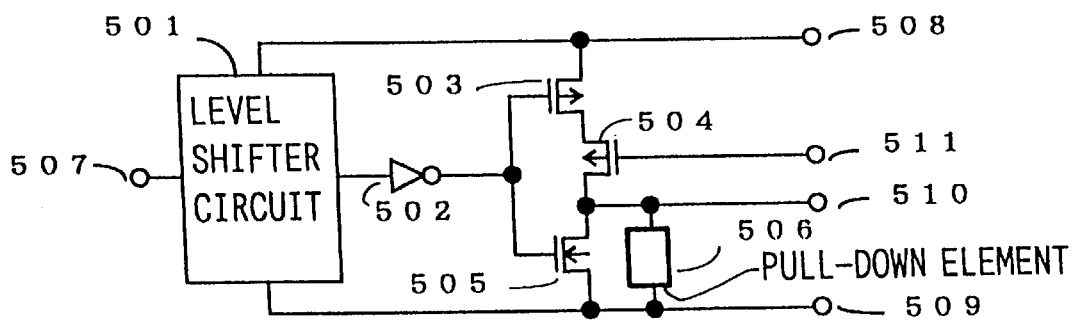
FIG. 5 is a circuit diagram of a part of the chargeable power source device of the present invention.
Figure 6:
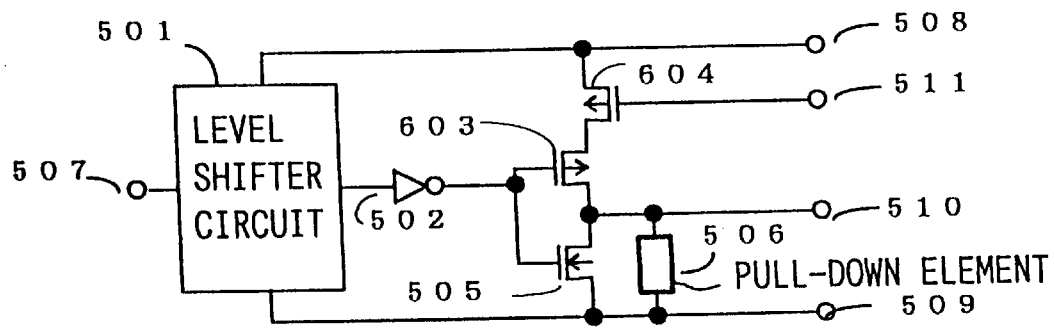
FIG. 6 is a circuit diagram showing an another part of the chargeable power source device of the present invention.

Although above-operation is described referring the low voltage detecting circuit 107 of FIG. 1 and FIG. 5 picked up from the low voltage detecting circuit 107 of FIG. 1, even the low voltage detecting circuit of FIG. 6 operates similarly.

In FIGS. 5 and 6, a numeral 507 shows an input terminal and a numeral 510 shows an output terminal.

A numeral 508 shows a positive power source terminal and a numeral 509 shows a negative power source terminal.

A numeral 511 shows a detection terminal.

The above-described operation is realized even if P-channel MOS transistors 503 and 504 of FIG. 1 and FIG. 5 connected in series are replaced with the P-channel MOS transistors 603 and 604 of FIG. 6.

As the threshold voltage of the P-channel MOS transistor is adjustable by varying the high impurity concentration, the voltage at which to stop charging is set easily.

As the pull-down element 506 is an element for fixing voltage between the gate and the source of the FET 111, it is possible to operate similarly even if the element is connected between the external terminal 105 and the output terminal 112B external from the low voltage detecting circuit 107.

Figure 7:
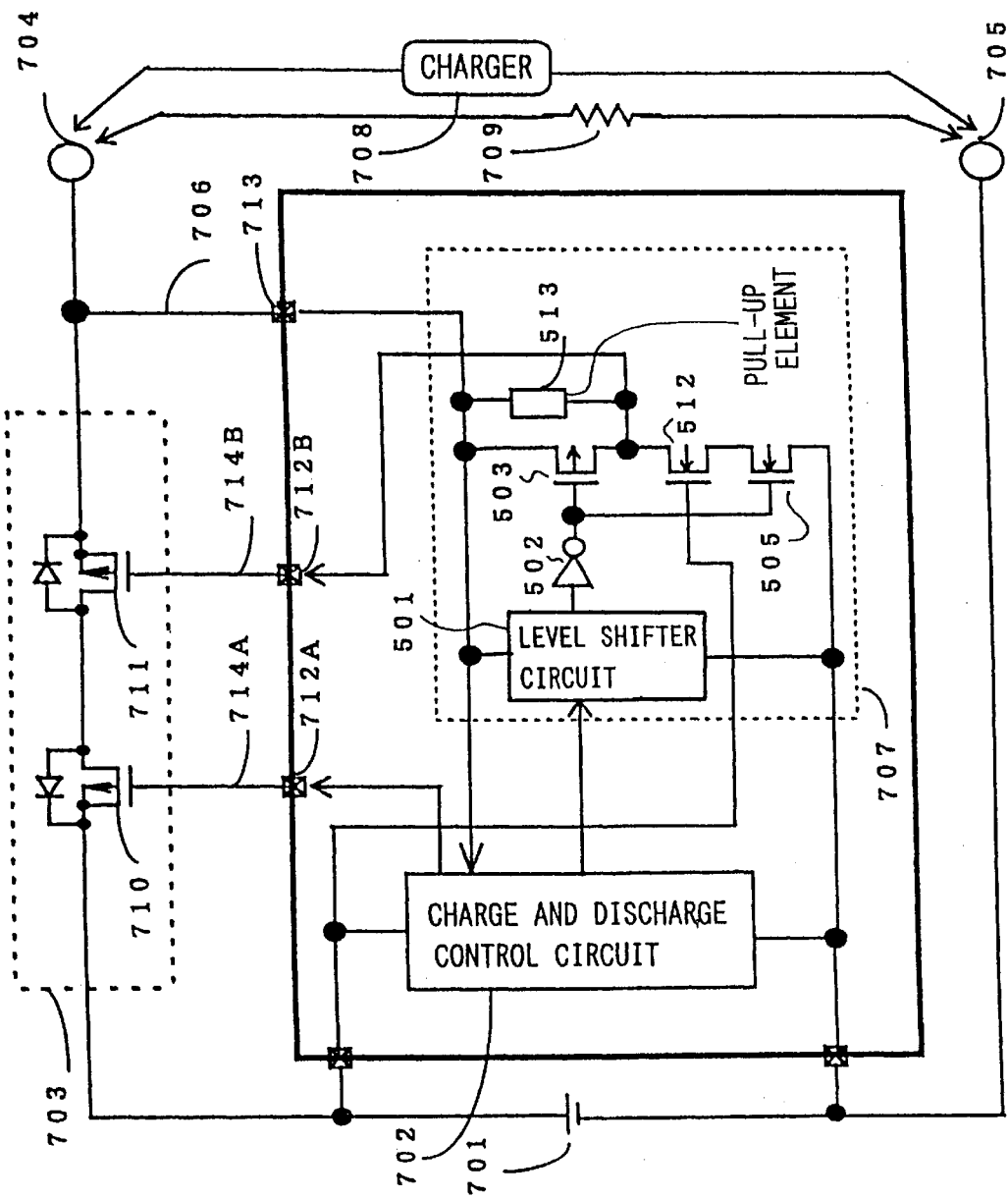
FIG. 7 is a circuit diagram of an another example of the chargeable power source device of the present invention.

Another embodiment of the present invention will be described referring FIG. 7. The difference from FIG. 1 is that the switch circuit comprises a P-channel FET not the N-channel FET. The secondary cell 702 is connected between the external terminals 704 and 705 through a switch circuit 703. The switch circuit comprises two P-channel FETs. Voltage of the secondary cell 701 is monitored by a charge and discharge control circuit 702 and a low voltage detecting circuit 707. The charge and discharge control circuit 702 is connected to an FET 710 with a signal line 714A, controls ON/OFF of the FET 710, is connected to an FET 711 with a signal line 714B through the low voltage detecting circuit 707, and controls ON/OFF of the FET 711. The low voltage detecting circuit 707 is connected between the externals terminals 704 and 705 in parallel to a charger through an overcurrent detecting terminal 713 so as to operate with the voltage as a power source.

A charger 708 for charging the secondary cell 701 or an instrument (a load 709 as viewed from the secondary cell) driven by the secondary cell is connected between external terminals 704 and 705. The FET 710 and the FET 711 are connected in series to the external terminal 705 or 704. In the embodiment, the FET 710 and the FET 711 are connected in series to the external terminal 705.

The construction of the low voltage detecting circuit 707 will be described referring FIG. 7.

A signal from the charge and discharge control circuit 702 is input to a level shifter circuit 501. Output of the level shifter circuit 501 is input to a waveform shaping inverter 502. Output of the inverter 502 is connected to a gate of P-channel MOS transistor 503 and a gate of N-channel MOS transistor 505. A source of the P-channel MOS transistor 503 is connected to the external terminal 704, and a drain thereof is connected to the drain of an N-channel MOS transistor 512 and one terminal of a pull-up element 513. The source of P-channel MOS transistor 503 is connected to the gate of the FET 711 in the switch circuit 703 from a charge signal output terminal 712 B through a signal line 714B. The source of N-channel MOS transistor 512 is connected to the drain of the N-channel MOS transistor 505, the gate thereof is connected to the positive terminal of the secondary cell 701, and the drain thereof is connected to the drain of the P-channel MOS transistor 503 and one terminal of a pull-up element 513. Further, the source of the N-channel MOS transistor 512 is connected to the gate of the FET 711 in the switch circuit 703 from an overcharge signal output terminal 712B through a signal line 714B. A source of an N-channel MOS transistor 505 is connected to the external terminal 705, the gate thereof is connected to output of the waveform shaping inverter 502, and the drain thereof is connected to the source of the P-channel MOS transistor 512. A power source of each element included in the low voltage detecting circuit 707, which are the level shifter circuit 501, the waveform shaping inverter 502, the P-channel MOS transistor 503, the N-channel MOS transistors 505 and 512, and the pull-up element 513, is supplied by the external terminals 704 and 705.

A numeral 706 shows a signal line.

Next, the operation of the low voltage detecting circuit 707 will be described referring FIG. 7. The level shifter circuit 501 outputs a high voltage ("H" hereafter) to the external terminal 704 when an input signal, namely the output signal of the charge and discharge control circuit 702, is a high level, and outputs a low voltage ("L" hereafter) to the external terminal 705 when the output signal of the charge and discharge control circuit 702 is a low level.

Output of the level shifter circuit 501 is shaped to be a more rectangular wave by the waveform shaping inverter 502, and the waveform shaping inverter 502 outputs "L" when output of the level shifter circuit 501 is "H" and outputs "H" when the output of the level shifter circuit 501 is "L." The N-channel transistor 512 monitors voltage of the secondary cell 701, turns ON when voltage of the secondary cell 701 is higher than the threshold voltage of the N-channel MOS transistor 512, and turns OFF when voltage of the secondary cell 701 is less than the threshold voltage of the N-channel MOS transistor 512. The last output stage comprising the P-channel MOS transistor 503, and the N-channel MOS transistors 505 and 512 outputs "H" at the output terminal 712B because, in the case which the N-channel MOS transistor 512 is ON, the P-channel MOS transistor 503 turns ON and the N-channel MOS transistor 505 turns OFF if output of the waveform shaping inverter 502 is "L." The last output stage outputs "L" at the output terminal 712B because the P-channel MOS transistor 503 turns OFF and the N-channel MOS transistor 505 turns ON if output of the waveform shaping inverter 502 is "H." This means that voltage of the output terminal 712B is turned "H" or "L" depending on the output signal of the charge and discharge control circuit 702 if voltage of the secondary cell 701 is higher than the threshold voltage of the N-channel MOS transistor 512. On the other hand, in the case that the N-channel MOS transistor 512 is OFF, the last output stage outputs "H" at the output terminal 712B because the N-channel MOS transistor 505 turns OFF and the P-channel MOS transistor 503 turns ON if output of the waveform shaping inverter 502 is "L." Although the N-channel MOS transistor 505 turns ON and the P-channel MOS transistor 503 turns OFF if output of the waveform shaping inverter 502 is "H", the last output stage outputs "H" at the output terminal 712B because the N-channel MOS transistor 512 keeps OFF and is connected to the pull-up element 513. Therefore, the last output stage forcibly outputs "H" independent of output level of the charge and discharge control circuit 702 in the case that voltage of the secondary cell 701 is lower than the threshold voltage of the N-channel MOS transistor 512.

Next, the whole circuit operation of FIG. 7 will be described.

The threshold voltage of the N-channel MOS transistor 512 is set at lower voltage than the overdischarge voltage and at the upper limit voltage under which the secondary cell 701 should not be permitted to be charged. The charge and discharge control circuit 702 monitors voltage of the secondary 701, outputs a low signal so as to turn the FET 710 ON when voltage of the secondary cell 701 is in the overcharge state, and outputs a high signal to the low voltage detecting circuit 707. As the secondary cell 701 is in the overcharge state, of course the voltage of the cell is higher than the threshold voltage of the N-channel MOS transistor 512. Therefore, the N-channel transistor 512 is ON and the low voltage detecting circuit 707 outputs "H" to the gate of the FET-B 711 in the switch circuit 703 as the overcharge signal from the charge and discharge control 702. As voltage between the gate and the source of the FET 711 turns 0V, the FET 711 turns OFF. Therefore, charge current from the charger 708 is cut so that charge to the secondary cell 701 stops.

The charge and discharge control circuit 702 outputs "H" to the output terminal 712A so as to turn the FET 710 OFF and outputs "H" to the low voltage detecting circuit 707 in the overdischarge state of voltage of the secondary cell 701. The P-channel transistor 512 remains ON because the voltage of the secondary cell 701 which is merely an overdischarge state an is higher than the threshold voltage of the N-channel transistor 512. Therefore, the low voltage detecting circuit 707 outputs "H" to the output terminal 712B by the signal of the charge and discharge control circuit 702 so as to turn the FET 711 ON. By the operation, discharge current to the load 709 is stopped and discharge of the secondary cell 701 stops. By replacing the load 709 with the charger 708 at this state, the FET 711 keeps ON, the parasitic diode of the FET 710 turns to a forward direction, a charge current path from the charger 708 to the secondary cell 701 is connected, and charging starts. This means that operation of previous protecting circuit is assured. The charge and discharge control circuit 702 outputs the overdischarge signal, namely "H" to the output terminal 712A and "L" to the low voltage detecting circuit 707 when voltage of the secondary cell 701 in the overdischarge state is less than the threshold voltage of the N-channel MOS transistor. However, voltage between the gate and the source of the FET 711 in the switch circuit 703 turns 0V and the FET 711 turns becomes OFF because the low voltage detecting circuit 707 outputs "H" to the output terminal 712B independent of the output of the charge and discharge control circuit 702. Although the parasitic diode of the FET 710 keeps the forward direction if the charger 708 is connected to the external terminals 704 and 705 at this state, discharge current to the secondary cell 701 is cut off and the secondary cell 701 is not charged because the FET 711 is OFF and the parasitic diode keeps the reverse direction.

Therefore, it is possible to stop charge in the abnormal state which voltage of the secondary cell 701 is less than overdischarge voltage and less than the threshold voltage of the N-channel MOS transistor.

Figure 8:
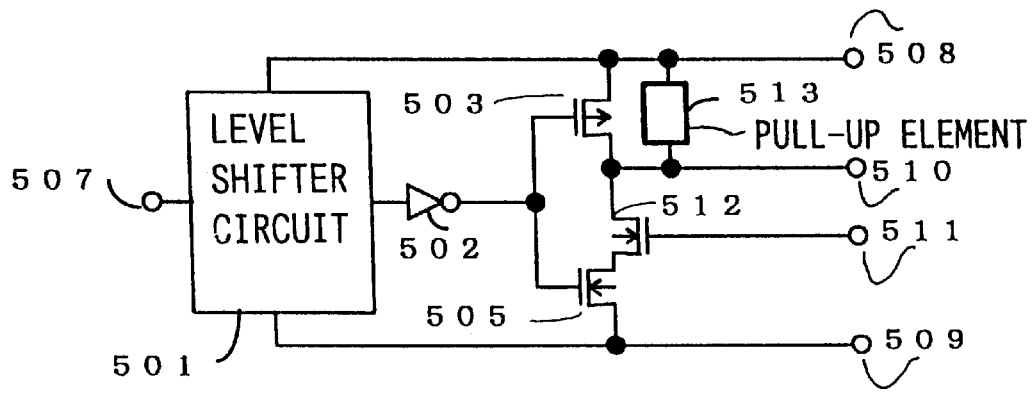
FIG. 8 is a circuit diagram of a part of an another chargeable power source device of the present invention.
Figure 9:
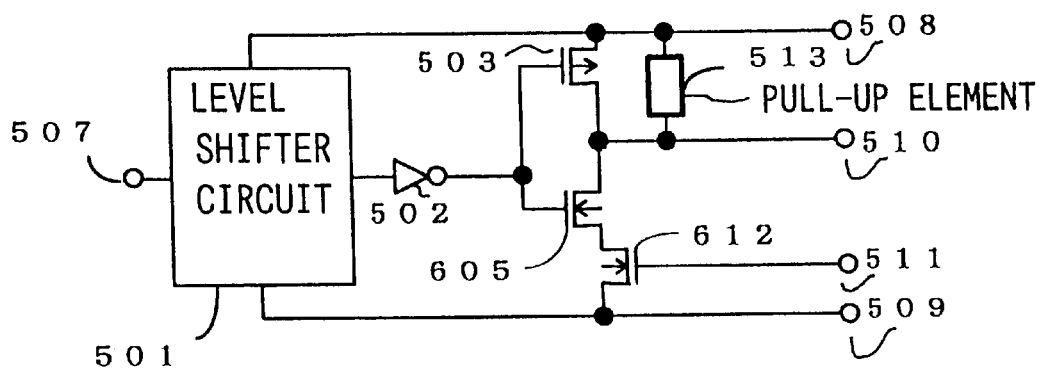
FIG. 9 is a circuit diagram showing a further example of a part of the chargeable power source device of the present invention.

Although above-operation is described with reference to the low voltage detecting circuit 707 of FIG. 7 and FIG. 8 picked up from the low voltage detecting circuit 707 of FIG. 7, even the low voltage detecting circuit of FIG. 9 operates similarly. The operation is realized even if the N-channel MOS transistors 512 and 505 of FIG. 7 connected in series are replaced with the N-channel MOS transistors 612 and 605 of FIG. 9.

As the threshold voltage of the N-channel MOS transistor is adjustable by varying the high impurity concentration, voltage stopping charge is set easily.

As the pull-up element 513 is an element for fixing voltage between the gate and the source of the FET 711, it is possible to operate similarly even if the element is connected between +V0 704 and the output terminal 712B external from the low voltage detecting circuit 707.

Figure 11:
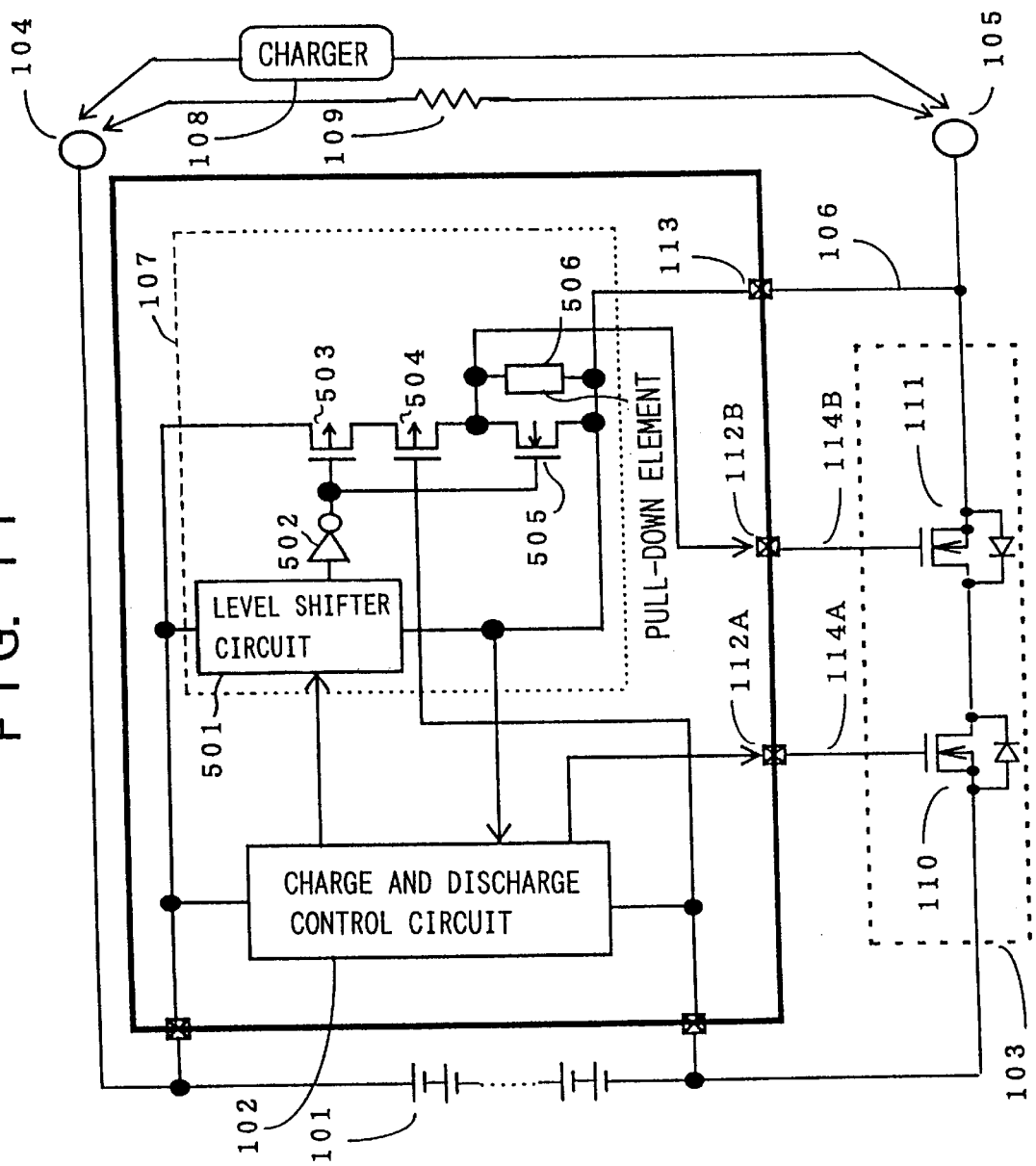
FIG. 11 is a circuit diagram showing a further another example of a part of the chargeable power source device of the present invention.

Although the above embodiments are described in the case of one secondary cell, it is possible to operate similarly with a similar circuit when more than two secondary cells are connected in series as shown in FIG. 11, the total voltage of the cells is monitored by the threshold voltage of the MOS transistor, and the voltage is less than the threshold voltage of the MOS transistor.

It is possible to monitor each voltage of the secondary cells connected in series using the threshold voltage of the MOS transistor. The circuit will be described below referring FIG. 11.

The threshold voltages of a P-channel MOS transistor 116 and an N-channel MOS transistor 118 are set at lower voltage than the overdischarge voltage and at the upper limit voltage which the secondary cells 101 and 115 should not be charged at.

The source of the P-channel MOS transistor 116 is connected to the positive power source terminal of the secondary cell 101, the drain thereof is connected to one terminal of a pull-down element 117 and input to an "OR" generating circuit 120, and the gate thereof is connected to the negative power source terminal of the secondary cell 101. The other terminal of the pull-down element 117 is connected to the negative power source terminal of the secondary cell 115. The source of the N-channel MOS transistor 118 is connected to the negative power source terminal of the secondary cell 115, the drain thereof is connected to one terminal of a pull-up element 119 and input to an "OR" generating circuit 120, and the gate thereof is connected to the positive power source terminal of the secondary cell 115. Output of the "OR" generating circuit 120 is connected to the gate of the P-channel MOS transistor 504. The connections of the other circuits are similar to the connection described in FIG. 1.

The circuit comprising the P-channel MOS transistor 116 and the pull-down element 117 monitors voltage of the secondary cell 101. When voltage of the secondary cell 101 is less than the threshold voltage of the P-channel transistor 116, the P-channel transistor 116 turns OFF and "L" is input to the "OR" generating circuit 120 by the pull-down element 117. When voltage of the secondary cell 101 is higher than the threshold voltage of the P-channel transistor 116, the P-channel transistor 116 turns ON and "H" is input to the "OR" generating circuit 120 by the pull-down element 117. The circuit comprising the N-channel MOS transistor 118 and pull-up element 119 monitors voltage of the secondary cell 115. When voltage of the secondary cell 115 is less than the threshold voltage of the N-channel transistor 118, the N-channel transistor 118 turns OFF and "L" is input to the "OR" generating circuit 120 by the pull-up element 119. The "OR" generating circuit 120 output "H" at output thereof in either case which output of the circuit comprising the P-channel MOS transistor 116 and the pull-down element 117 is "L" or output of the circuit comprising N-channel MOS transistor 118 and the pull-up element 119 is "H". The P-channel MOS transistor 504 turns OFF only in the case which output of the "OR" generating circuit 120 is "H." The operation of the low voltage detecting circuit is similar to the description in FIG. 1.

Therefore, the low voltage detecting circuit 107 outputs "L" at the output terminal 112B thereof, turns the FET 111 OFF, and cuts charge current from the charger 108 to the secondary cells 101 and 115 so as to stop charge when any of voltages of the secondary cells 101 and 115 is less than the threshold voltage of the MOS transistors 116 and 118.

Figure 10:
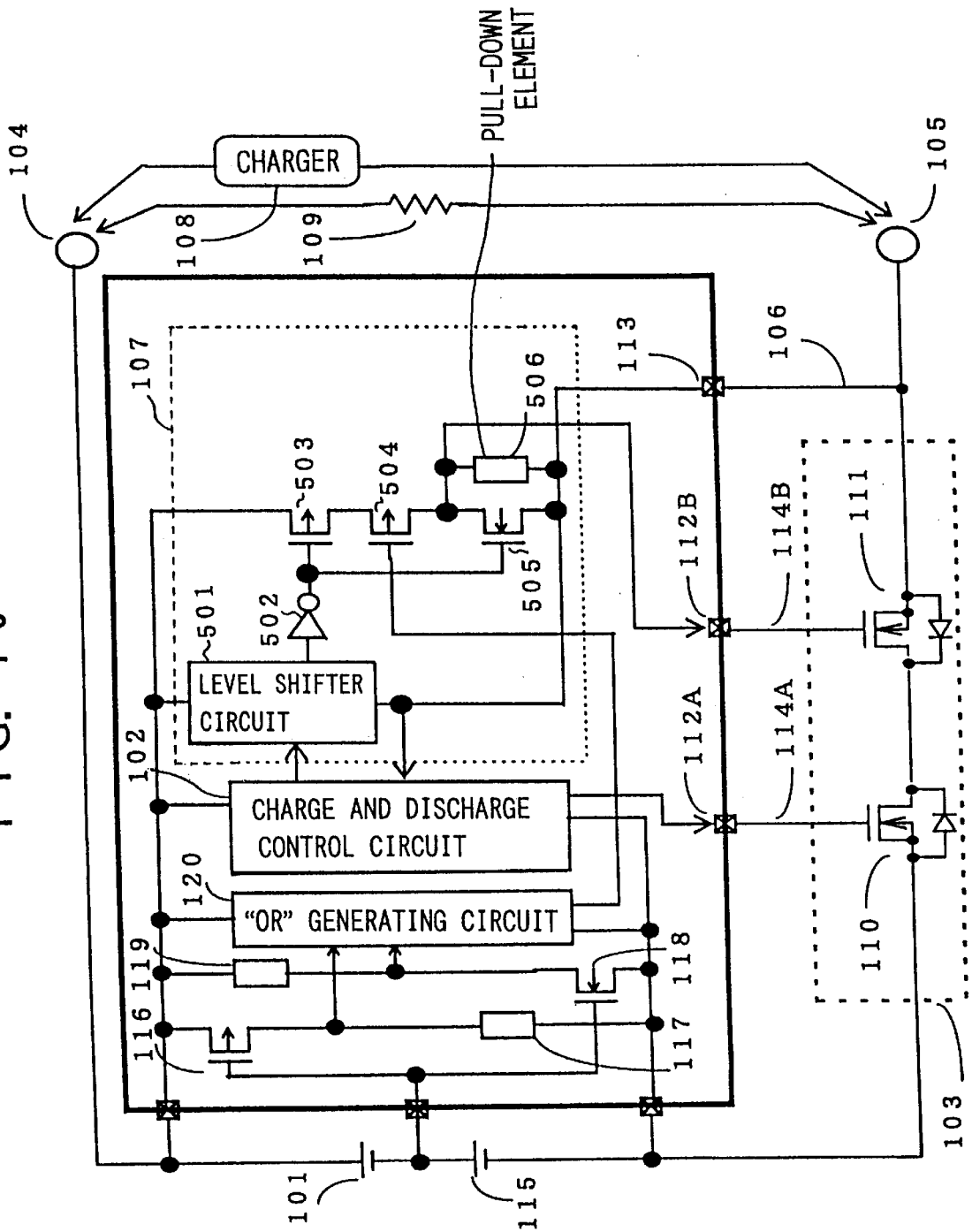
FIG. 10 is a circuit diagram showing a further example of a part of the chargeable power source device of the present invention.

Although the switch circuit 103 comprising two N-channel FETs is described above referring FIG. 10, the relation of the power source, input, and output of the low voltage detecting circuit 107 does not defer from the description of FIG. 1 because the number of the secondary cells connected in series is increased and only the P-channel transistor 116, the N-channel transistor 118, the pull-down element 117, the pull-up element 119, and the "OR" generating circuit 120 are added to the embodiment of FIG. 1 for monitoring each voltage. Therefore, if the switch circuit 103 comprises two P-channel FETs, the above five elements (the P-channel transistor 116, the N-channel transistor 118, the pull-down element 117, the pull-up element 119, and the "OR" generating circuit 120) are added to FIG. 7 and the gate of the N-channel transistor 512 of FIG. 7 is set as the output of the "OR" generating circuit to make the similar operation possible. Although two secondary cells connected in series are described in the description of FIG. 10, it is possible that voltage of each secondary cell is monitored by the threshold voltage of the MOS transistor, output thereof is input to the "OR" generating circuit, and output thereof is connected to the detected terminal of the low voltage detecting circuit.

Adding simple circuits, as above-described, the present invention turns the switch circuit OFF so as to cut charge current and stops to charge to an abnormal cell when a charger is connected in the state which voltage of the secondary cell is less than the threshold voltage of the MOS transistor. Therefore, the present invention has advantages to protect the secondary cell from break and to improve reliability and safety of whole of the instrument.

What is claimed is:

1. A charge and discharge control circuit comprising: circuitry for monitoring whether the voltage of at least one secondary cell is above or below the threshold voltage of a MOS transistor and outputting a signal depending upon the monitored voltage for controlling the charging of the at least one secondary cell based upon the signal.

2. A charge and discharge control circuit according to claim 1; wherein the circuitry includes means for preventing charging of the at least one secondary cell when the voltage of the at least one secondary cell is less than the threshold voltage of the MOS transistor.

3. A charge and discharge control circuit according to claim 1; wherein the circuitry includes one of a pull-up or pull-down element at a signal output terminal.

4. A charge and discharge control circuit comprising:
a charge and discharge control circuit for monitoring the voltage of at least one secondary cell and outputting a signal used for controlling the charge and discharge of the at least one secondary cell;
a switch circuit for receiving the output signal of the charge and discharge control circuit for preventing charge or discharge of the at least one secondary cell when the at least one secondary cell is in one of and overcharged and an overdischarged state; and
a low voltage detecting circuit for receiving the output signal of the charge and discharge control circuit, for detecting whether the voltage of at least one secondary cell is below a predetermined value at which charging of the secondary cell is to be prevented, the predetermined value being less than the voltage associated with an overdischarged state, and for controlling the switch circuit to prevent charging of the secondary cell.

5. A charge and discharge control circuit according to claim 4; wherein the predetermined value is the threshold voltage of a MOS transistor, so that the low voltage detecting circuit stops charging of the secondary cell when the voltage of the secondary cell is less than the threshold voltage of the MOS transistor.

6. A charge and discharge control circuit for monitoring the voltage of a secondary cell, comprising: a first circuit for detecting whether the voltage of the secondary cell is in an overcharged or overdischarged state, generating a first signal when the secondary cell is in an overcharged state and generating a second signal when the secondary cell is in an overdischarged state; and a second circuit for detecting whether the voltage of the secondary cell is below the threshold voltage of a MOS transistor and generating a third signal used for controlling the charging of the secondary cell.

7. A charge and discharge control circuit according to claim 6; wherein the second circuit generates the third signal when the voltage of the secondary cell is less than the threshold voltage of the MOS transistor, and the third signal is used for preventing the charging of the secondary cell.

8. A charge and discharge control circuit according to claim 6; wherein the first circuit comprises a charge and discharge control circuit connected to the secondary cell and having at least one output terminal for outputting the first and second signals, the second circuit comprises a low voltage detecting circuit having a MOS transistor connected to the secondary cell so that conduction of the MOS transistor is controlled based on the voltage of the secondary cell.

9. A charge and discharge control circuit according to claim 6; further comprising a third circuit receptive of an output of the first circuit and the second circuit for controlling a current path between the secondary cell and an output terminal so that the current path is opened when the secondary cell is in one of an overcharged state and an overdischarged state, and so that the current path is opened when the voltage of the secondary cell is below the threshold voltage of the MOS transistor to prevent charging of the secondary cell.

10. A charge and discharge control circuit according to claim 9; wherein the third circuit comprises a switch circuit having first and second series-connected transistors, the first transistor being receptive of the first signal to open the current path when the secondary cell is in an overcharged state to prevent further charging of the secondary cell, the second transistor being receptive of the second signal to open the current path when the secondary cell is in an overdischarged state to prevent further discharge of the secondary cell, and a selected one of the first and second transistors being receptive of the third signal to open the current path when the secondary cell is below the threshold voltage of the MOS transistor to prevent charging of the secondary cell.

11. A charge and discharge control circuit according to claim 10; wherein the selected transistor is formed with a parasitic diode which permits a current to flow therethrough when the transistor is off to permit charging of the secondary cell when the secondary cell is in an overdischarged state.

12. A charge and discharge control circuit according to claim 6; wherein the secondary cell comprises a plurality of batteries connected in series.

\* \* \* \* \*